(12) United States Patent
Park

(10) Patent No.: US 10,892,731 B2
(45) Date of Patent: Jan. 12, 2021

(54) BULK ACOUSTIC WAVE FILTER DEVICE

(71) Applicant: SAMSUNG ELECTRO-MECHANICS CO., LTD., Suwon-si (KR)

(72) Inventor: Jang Ho Park, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 16 days.

(21) Appl. No.: 16/406,492

(22) Filed: May 8, 2019

(65) Prior Publication Data
US 2020/0136585 A1 Apr. 30, 2020

(30) Foreign Application Priority Data
Oct. 25, 2018 (KR) .................. 10-2018-0127845

(51) Int. Cl.
| | |
|---|---|
| *H03H 9/02* | (2006.01) |
| *H03H 9/05* | (2006.01) |
| *H03H 9/56* | (2006.01) |
| *H03H 9/17* | (2006.01) |
| *H03H 9/13* | (2006.01) |
| *H03H 9/10* | (2006.01) |

(52) U.S. Cl.
CPC ...... *H03H 9/02102* (2013.01); *H03H 9/0514* (2013.01); *H03H 9/1014* (2013.01); *H03H 9/13* (2013.01); *H03H 9/17* (2013.01); *H03H 9/173* (2013.01); *H03H 9/56* (2013.01)

(58) Field of Classification Search
CPC ........ H03H 9/02102; H03H 9/56; H03H 9/17; H03H 9/13; H03H 9/1014; H03H 9/0514; H03H 9/173; H03H 9/54; H03H 9/02015; H03H 9/02047; H03H 9/15

USPC .................................................. 333/187, 188
See application file for complete search history.

(56) References Cited

U.S. PATENT DOCUMENTS

| | | | |
|---|---|---|---|
| 6,384,697 B1* | 5/2002 | Ruby | H03H 3/02 333/187 |
| 9,444,428 B2* | 9/2016 | Ruby | H03H 9/02102 |
| 2003/0132517 A1 | 7/2003 | Matsuta et al. | |
| 2004/0056735 A1 | 3/2004 | Nomura et al. | |

FOREIGN PATENT DOCUMENTS

| | | |
|---|---|---|
| JP | 3879643 B2 | 2/2007 |
| JP | 4173308 B2 | 10/2008 |
| JP | 4835238 B2 | 12/2011 |

\* cited by examiner

*Primary Examiner* — Robert J Pascal
*Assistant Examiner* — Jorge L Salazar, Jr.
(74) *Attorney, Agent, or Firm* — NSIP Law

(57) ABSTRACT

A bulk acoustic wave filter device includes a substrate including an insulating layer, a resonance portion including a bottom electrode, disposed on the substrate, a piezoelectric layer, disposed above at least a portion of the bottom electrode, and a top electrode disposed above at least a portion of the piezoelectric layer, a wiring portion connected to the resonance portion such that the top electrode or the bottom electrode extends into the wiring portion, a connection electrode connecting the top electrode and the bottom electrode to an external device, and a heat transfer member connecting a portion of at least one of the bottom electrode and the top electrode that is disposed in the wiring portion to the substrate. The resonance portion is provided with a cavity disposed below the bottom electrode, and the heat transfer member is disposed outside of the cavity.

19 Claims, 5 Drawing Sheets

BULK ACOUSTIC WAVE FILTER DEVICE

CROSS-REFERENCE TO RELATED APPLICATION

This application claims the benefit under 35 U.S.C. § 119(a) of Korean Patent Application No. 10-2018-0127845 filed on Oct. 25, 2018 in the Korean Intellectual Property Office, the entire disclosure of which is incorporated herein by reference for all purposes.

BACKGROUND

1. Field

The following description relates to a bulk acoustic wave filter device.

2. Description of Background

As a frequency band of wireless communications has been widened and a frequency range has increased to high frequencies due to ever-increasing demand for high-capacitance and high-speed data communications, demand for a bulk acoustic wave (BAW) filter, a frequency band filter, has rapidly increased. As 4G wireless communications become saturated, it is expected that 5G wireless communications will be introduced. Accordingly, high-speed data communications are activated, and a high-frequency, wideband, and high-power bulk acoustic wave filter (BAW filter) product is required.

However, in the case of a high-frequency, wide-band, and high-power bulk acoustic wave filter (BAW Filter) product, high power may be applied to increase heat generation. Accordingly, a temperature rise may occur in an entire or localized area of the BAW filter product.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave filter device includes a substrate including an insulating layer, a resonance portion including a bottom electrode, disposed on the substrate, a piezoelectric layer, disposed above at least a portion of the bottom electrode, a top electrode disposed above at least a portion of the piezoelectric layer, and a cavity disposed below the bottom electrode, a wiring portion connected to the resonance portion such that the top electrode or the bottom electrode extends into the wiring portion, a connection electrode connecting the top electrode and the bottom electrode to an external device, and a heat transfer member disposed outside of the cavity and connecting a portion of at least one of the bottom electrode and the top electrode that is disposed in the wiring portion to the substrate.

The heat transfer member may be disposed between the connection electrode and the cavity.

The heat transfer member may be connected to the insulating layer of the substrate or may be connected to a base of the substrate disposed below the insulating layer.

The heat transfer member may include a heat conducting material including one or more of molybdenum (Mo), ruthenium (Ru), tungsten (W), iridium (Ir), platinum (Pt), copper (Cu), titanium (Ti), tantalum (Ta), nickel (Ni), chromium (Cr), aluminum (Al), or alloys thereof.

The resonance portion may include a membrane layer that forms the cavity together with the substrate; and a passivation layer disposed above the top electrode. The bottom electrode may include a portion disposed in an upper portion of the cavity. The piezoelectric layer may include a portion disposed to cover the bottom electrode. The top electrode may include a portion disposed to cover the piezoelectric layer. The passivation layer may be at least partially disposed in a region in which the bottom electrode and the top electrode do not overlap each other.

The heat transfer member may be connected to the bottom electrode and may penetrate through the membrane layer.

The bulk acoustic wave filter device may include a first metal pad disposed above the bottom electrode.

The heat transfer member may be connected to the top electrode and may penetrate through the membrane layer and the piezoelectric layer.

The bulk acoustic wave filter device may include a second metal pad disposed above the top electrode.

The resonance portion may include a membrane layer that forms the cavity together with the substrate; and an insertion layer disposed to cover at least a portion of the bottom electrode. The bottom electrode may be disposed above the membrane layer. The insertion layer may be disposed to cover at least a portion of the bottom electrode. The piezoelectric layer may be disposed on the bottom electrode to cover the insertion layer. The top electrode may include a portion disposed above the piezoelectric layer.

The bulk acoustic wave filter device may include an etch stop portion disposed to cover the cavity.

The bulk acoustic wave filter device may include a first layer disposed outside of the etch stop portion.

The piezoelectric layer may include a piezoelectric portion, disposed in a flat portion, and a bent portion disposed in an extending portion that extends from the piezoelectric layer.

The heat transfer member may be connected to the bottom electrode and may penetrate through the membrane layer and the first layer.

The heat transfer member may be connected to the top electrode and may penetrate through the piezoelectric layer, the membrane layer, and the first layer.

In another general aspect, a bulk acoustic wave filter device includes: a substrate including an insulating layer; a resonance portion including a bottom electrode disposed on the substrate, a piezoelectric layer disposed above at least a portion of the bottom electrode, and a top electrode disposed above at least a portion of the piezoelectric layer; a wiring portion connected to the resonance portion such that the bottom electrode or the top electrode extends into the wiring portion; a connection electrode to connect the top electrode and the bottom electrode to an external device; and a heat transfer member connecting a portion of the top electrode or the bottom electrode that extends into the wiring portion to the substrate.

In another general aspect, a bulk acoustic wave filter device includes: a substrate; a resonance portion comprising a top electrode, a bottom electrode, a piezoelectric layer disposed between the top electrode and the bottom electrode, and a membrane layer disposed between the bottom electrode and the substrate to form a cavity with the substrate; a first heat transfer member that connects a portion of the top electrode that extends beyond the resonance portion to the substrate; and a second heat transfer member that connects a portion of the bottom electrode that extends beyond the resonance portion to the substrate.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
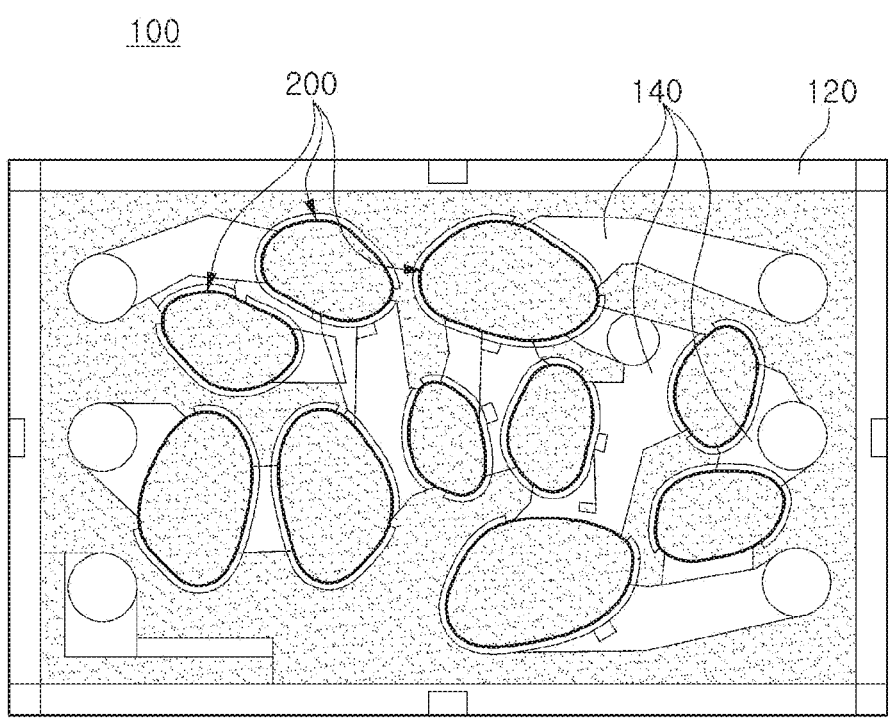
FIG. 1 is a plan view of a bulk acoustic wave filter device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples of the present disclosure will be described as follows with reference to the attached drawings.

Figure 2:
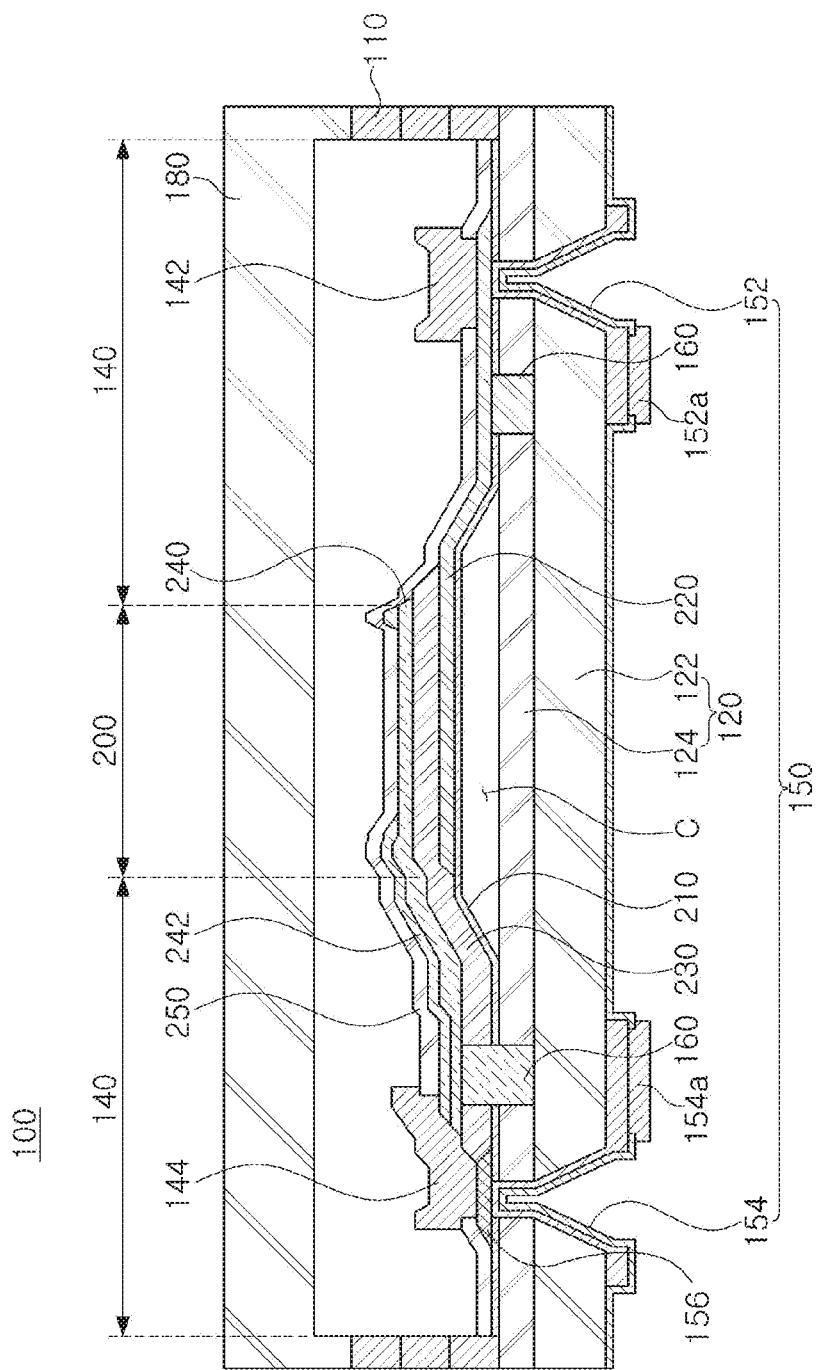
FIG. 2 is a cross-sectional view of the bulk acoustic wave filter device according to an example.

FIG. 1 is a plan view of a bulk acoustic wave filter device according to an example, and FIG. 2 is a cross-sectional view of the bulk acoustic wave filter device according to an example.

Referring to FIGS. 1 and 2, a bulk acoustic wave filter device 100 may include a substrate 120, a resonance portion 200, a wiring portion 140, a connection electrode 150, a heat transfer member 160, and a cap 180, as an example.

The substrate 120 may include a base 122 and an insulating layer 124 disposed on a top surface of the base 122. The base 122 may be a silicon substrate. For example, the base 122 may be a silicon wafer or a silicon-on-insulator (SOI) type substrate.

The insulating layer 124 may be disposed on the top surface of the base 122 and may serve to electrically isolate the base 122 from overlying configurations. Also, the insulating layer 124 may serve to prevent the base 122 from being etched by an etching gas when a cavity C is formed during a manufacturing process.

The insulating layer 124 may be formed of at least one of silicon dioxide (SiO2), silicon nitride (Si3N4), aluminum oxide (Al2O3), and aluminum nitride (AlN), and may be formed by at least one of a chemical vapor deposition process, an RF magnetron sputtering process, and an evaporation process.

As an example, the connection electrode 150, connected to a top electrode 240 or a bottom electrode 220 of the resonance portion 200, may be disposed on the substrate 120.

The resonance portion 200 may be disposed on the substrate 120. For example, the resonance portion 200 may include a membrane layer 210, the bottom electrode 220, a piezoelectric layer 230, the top electrode 240, and a passivation layer 250.

The membrane layer 210 may form the cavity C, together with the substrate 120. The membrane layer 210 may be formed of a material having a low reactivity with respect to an etching gas when a first layer, not illustrated, is removed. The membrane layer 210 may be a dielectric layer containing any one of silicon nitride (Si3N4), silicon oxide (SiO2), manganese oxide (MgO), zirconium oxide (ZrO2), aluminum nitride (AlN), lead zirconate titanate (PZT), gallium arsenide (GaAs), hafnium oxide (HfO2), aluminum oxide (Al2O3), titanium oxide (TiO2), and zinc oxide (ZnO).

A seed layer, not illustrated, formed of aluminum nitride (AlN) may be disposed on the membrane layer 210. For example, the seed layer may be disposed between the membrane layer 210 and the bottom electrode 220. The seed layer may be formed using a dielectric or a metal having a hexagonal close-packed (HCP) crystal structure in addition to aluminum nitride (AlN). As an example, when the seed layer is a metal, the seed layer may be formed of titanium (Ti).

The bottom electrode 220 may be disposed on the membrane layer 210, and may have a portion disposed in an upper portion of the cavity C. The bottom electrode 220 may be used as either one of an input electrode and an output electrode inputting and/or outputting an electrical signal such as a radio-frequency (RF) signal, and the like.

The bottom electrode 220 may be formed of a heat conducting material such as molybdenum (Mo), or alloys thereof. However, a material of the bottom electrode 220 is not limited to molybdenum (Mo), and the bottom electrode 220 may be formed of a heat conducting material such as ruthenium (Ru), tungsten (W), iridium (Ir), platinum (Pt), copper (Cu), titanium (Ti), tantalum (Ta), nickel (Ni), chromium (Cr), and the like, or alloys thereof.

The piezoelectric layer 230 may be disposed to cover at least the bottom electrode 220 disposed above the cavity C. The piezoelectric layer 230 may be a portion causing a piezoelectric effect to convert electrical energy into mechanical energy in the form of an acoustic wave, and may be formed of any one of aluminum nitride (AlN), zinc oxide (ZnO), and lead zirconium titanium oxide (PZT; PbZrTiO). When the piezoelectric layer 230 is formed of aluminum nitride (AlN), the piezoelectric layer 230 may further include a rare earth metal. As an example, the rare earth metal may include at least one of scandium (Sc), erbium (Er), yttrium (Y), and lanthanum (La). As an example, a transition metal may include at least one of titanium (Ti), zirconium (Zr), hafnium (Hf), tantalum (Ta), and niobium (Nb). Magnesium (Mg), a divalent metal, may also be included.

The top electrode 240 may be disposed to cover at least a portion of the piezoelectric layer 230 disposed above the cavity C. The top electrode 240 may be used as either one of an input electrode and an output electrode inputting and/or outputting an electrical signal such as a radio-frequency (RF) signal, and the like. For example, when the bottom electrode 220 is used as an input electrode, the top electrode 240 may be used as an output electrode. When the bottom electrode 220 is used as an output electrode, the top electrode 240 may be used as an input electrode.

The top electrode 240 may be formed of a heat conducting material such as molybdenum (Mo), or alloys thereof. However, a material of the top electrode 240 is not limited to molybdenum (Mo), and the top electrode 240 may be formed of a heat conducting material such as ruthenium (Ru), tungsten (W), iridium (Ir), platinum (Pt), copper (Cu), titanium (Ti), tantalum (Ta), nickel (Ni), chromium (Cr), and the like, or alloys thereof.

The top electrode 240 may be provided with a frame portion 242 having a thickness greater than a thickness of other portions of the top electrode 240. In other words, the portion of the top electrode that includes the frame portion 242 may be thicker than the other portions of the top electrode that do not include the frame portion 242.

The passivation layer 250 may be disposed in regions other than a region in which the bottom electrode 220 and the top electrode 240 overlap each other. The passivation layer 250 may prevent damage to the top electrode 240 and the bottom electrode 220 during a process.

A portion of the passivation layer 250 may be removed by etching for frequency control in a final process. For example, the thickness of the passivation layer 250 may be adjusted. As an example, the passivation layer 250 may be a dielectric layer containing any one of silicon nitride (Si3N4), silicon oxide (SiO2), manganese oxide (MgO), zirconium oxide (ZrO2), aluminum nitride (AlN), lead zirconate titanate (PZT), gallium arsenide (GaAs), hafnium oxide (HfO2), aluminum oxide (Al2O3), titanium oxide (TiO2), and zinc oxide (ZnO).

As an example, the resonance portion 200 includes a region in which the bottom electrode 220, the piezoelectric layer 230, and the top electrode 240 all overlap each other, and the wiring portion 140 includes a region in which the bottom electrode 220 or the top electrode 240 is disposed outside the resonance portion 200.

The wiring portion 140 is connected to the resonance portion 200. The bottom electrode 220 or the top electrode 240 extends to be disposed in the wiring portion 140. In a region of the wiring portion 140 in which the bottom electrode 220 is disposed, the membrane layer 210 may be disposed below the bottom electrode 220, and a first metal pad 142 may be disposed above the bottom electrode 220. In a region of the wiring portion 140 in which the top electrode 240 is disposed, the piezoelectric layer 230 and the top electrode 240 may be sequentially laminated and a second metal pad 144 may be disposed to be connected to the top electrode 240.

The connection electrode 150 is disposed in the wiring portion 140 and serves to connect the bottom electrode 220 and the top electrode 240 to an external device. As an example, the connection electrode 150 may include a bottom electrode connection electrode 152 for connecting the bottom electrode 220 to an external device and a top electrode connection electrode 154 for connecting the top electrode 240 to an external device.

As an example, the bottom electrode connection electrode 152 and the top electrode connection electrode 154 may be disposed to penetrate through the substrate 120. The bottom electrode connection electrode 152 may be directly connected to the bottom electrode 220, and the top electrode connection electrode 154 may be connected to the top electrode 240 via the second metal pad 144 and a connection member 156.

Connection pads 152a and 154a, disposed below the substrate 120, may be mounted on the bottom electrode connection electrode 152 and the top electrode connection electrode 154, respectively. Each of the connection pads 152a and 154b may be provided with a solder through which they may be connected to a mainboard, not illustrated.

The connection electrode 150 may serve to discharge heat, generated by the resonance portion 200, to the outside.

A case, in which the connection electrode 150 is disposed below the substrate 120, has been described in the present example. However, the connection electrode 150 may be connected to an external device through the cap 180. For example, the connection electrode 150 may be connected to the first and second metal pads 142 and 144 to be disposed on an external surface of the cap 180 through the cap 180.

As an example, the connection electrode 150 may be a through-silicon-via (TSV) electrode.

The heat transfer member 160 connects at least one of the bottom and top electrodes 220 and 240, disposed in the wiring portion 140, to the substrate 120. The heat transfer member 160 serves to provide a heat transfer path through which heat, generated by the resonance portion 200, is transferred to the substrate 120. As an example, the heat transfer member 160 may be formed of a heat conducting material such as molybdenum (Mo), ruthenium (Ru), tungsten (W), iridium (Ir), platinum (Pt), copper (Cu), titanium (Ti), tantalum (Ta), nickel (Ni), chromium (Cr), aluminum (Al), or alloys thereof.

In the case in which the heat transfer member 160 is connected to the bottom electrode 220, the heat transfer member 160 is disposed to penetrate through the membrane layer 210. In the case in which the heat transfer member 160 is connected to the top electrode 240, the heat transfer member 160 is disposed to penetrate through the membrane layer 210 and the piezoelectric layer 230.

The heat transfer member 160 connects the bottom electrode 220 and the top electrode 240 to the substrate 120 to serve as a heat transfer path through which the heat, generated by the resonance portion 200, is transferred to the substrate 120. As an example, the heat transfer member 160 penetrates through the insulating layer 124 to be connected to the base 122 of the substrate 120.

Accordingly, since the heat, generated by the resonance portion 200, is transferred to the substrate 200 through the heat transfer member 160 together with the connection electrode 150, heat dissipation efficiency may be improved.

The cap 180 is coupled to the substrate 120 to form an internal space together with the substrate 120. The cap 180 and the substrate 120 are bonded through an adhesive member 110. The adhesive member 110 may be formed of a metal such as tin (Sn), gold (Au), or the like. As an example, the cap 180 may be a silicon wafer or a silicon-on-insulator (SOI) type substrate.

Since the heat, generated by the resonance portion 200, is transferred to the substrate 120 through the heat transfer member 160, heat dissipation may be smoothly performed.

Accordingly, frequency shift, caused when a temperature of the resonance portion 200 is rapidly increased, and loss, occurring at a specific frequency, may be reduced. Moreover, degradation in isolation characteristics, caused when a temperature of the resonance portion 200 is rapidly increased, may be prevented.

FIG. 2 is an enlarged view of only one resonance portion 200 among a plurality of resonance portions 200 illustrated in FIG. 1, and does not correspond to the cross-sectional view of FIG. 1.

Figure 3:
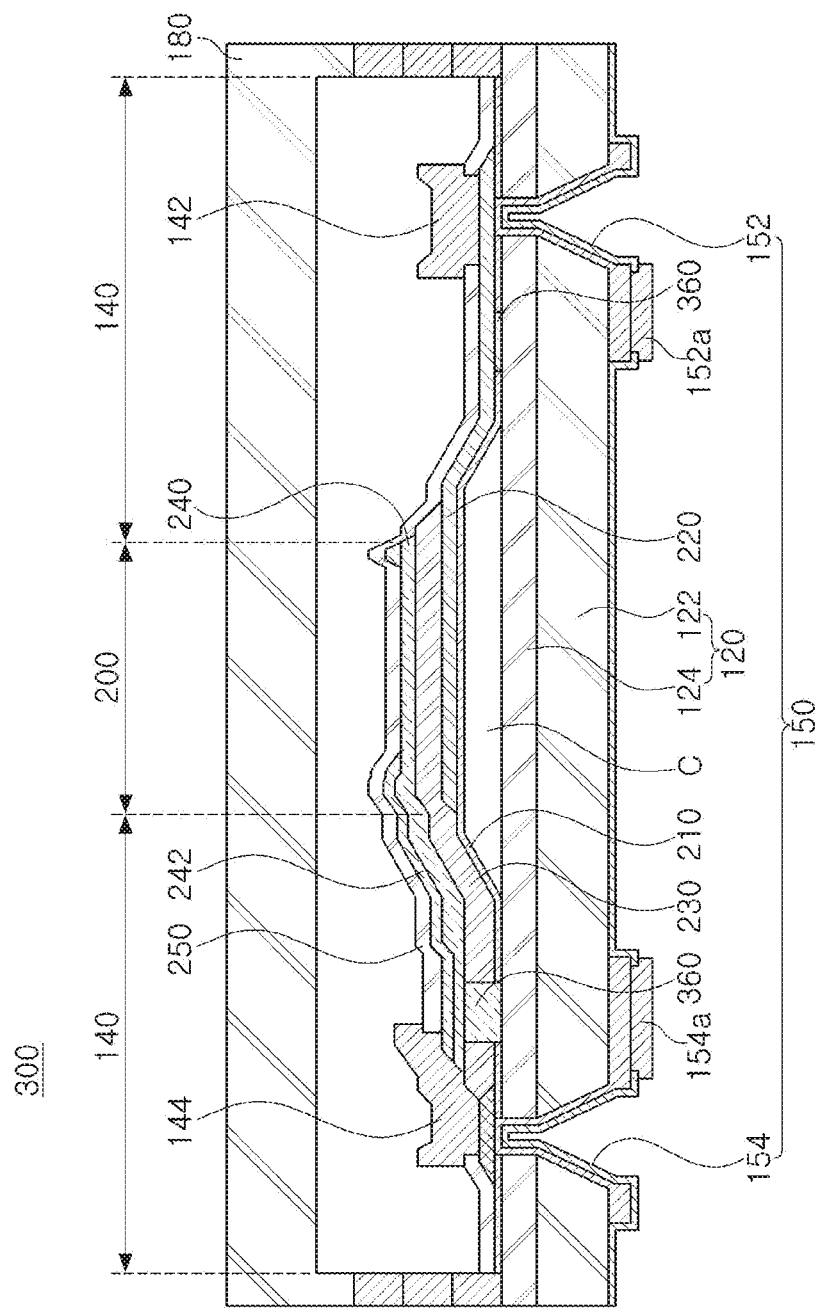
FIG. 3 is a cross-sectional view of the bulk acoustic wave filter device according to another example.

FIG. 3 is a cross-sectional view of a bulk acoustic wave filter device according to another example.

Referring to FIG. 3, a bulk acoustic wave filter device 300 may include a substrate 120, a resonance portion 200, a wiring portion 140, a connection electrode 150, a heat transfer member 360, and a cap 180, as an example.

Since the substrate 120, the resonance portion 200, the wiring portion 140, the connection electrode 150, and the cap 180 are substantially the same as described with respect to FIG. 2, detailed descriptions thereof will be omitted herein.

The heat transfer member 360 connects at least one of a bottom electrode 220 and a top electrode 240, disposed at the wiring portion 140, to the substrate 120. The heat transfer member 360 serves to provide a heat transfer path through which heat, generated by the resonance portion 200, is transferred to the substrate 120. As an example, the heat transfer member 360 may a heat conducting material such as molybdenum (Mo), ruthenium (Ru), tungsten (W), iridium (Ir), platinum (Pt), copper (Cu), titanium (Ti), tantalum (Ta), nickel (Ni), chromium (Cr), aluminum (Al), and the like, or alloys thereof.

In the case in which the heat transfer member 360 is connected to the bottom electrode 220, the heat transfer member 360 is disposed to penetrate through the membrane layer 210. In the case in which is connected to the top electrode 240, the heat transfer member 360 is disposed to penetrate through the membrane layer 210 and the piezoelectric layer 230.

The heat transfer member 360 may connect the bottom electrode 220 and the top electrode 240 to the substrate 120 to serve as a heat transfer path through which the heat, generated by the resonance portion 200, is transferred to the substrate 120. As an example, the heat transfer member 360 may be connected to the insulating layer 124 of the substrate 360.

Accordingly, since the heat, generated by the resonance portion 200, is transferred to the substrate 120 through the heat transfer member 360 together with the connection electrode 150, heat dissipation efficiency may be improved.

Figure 4:
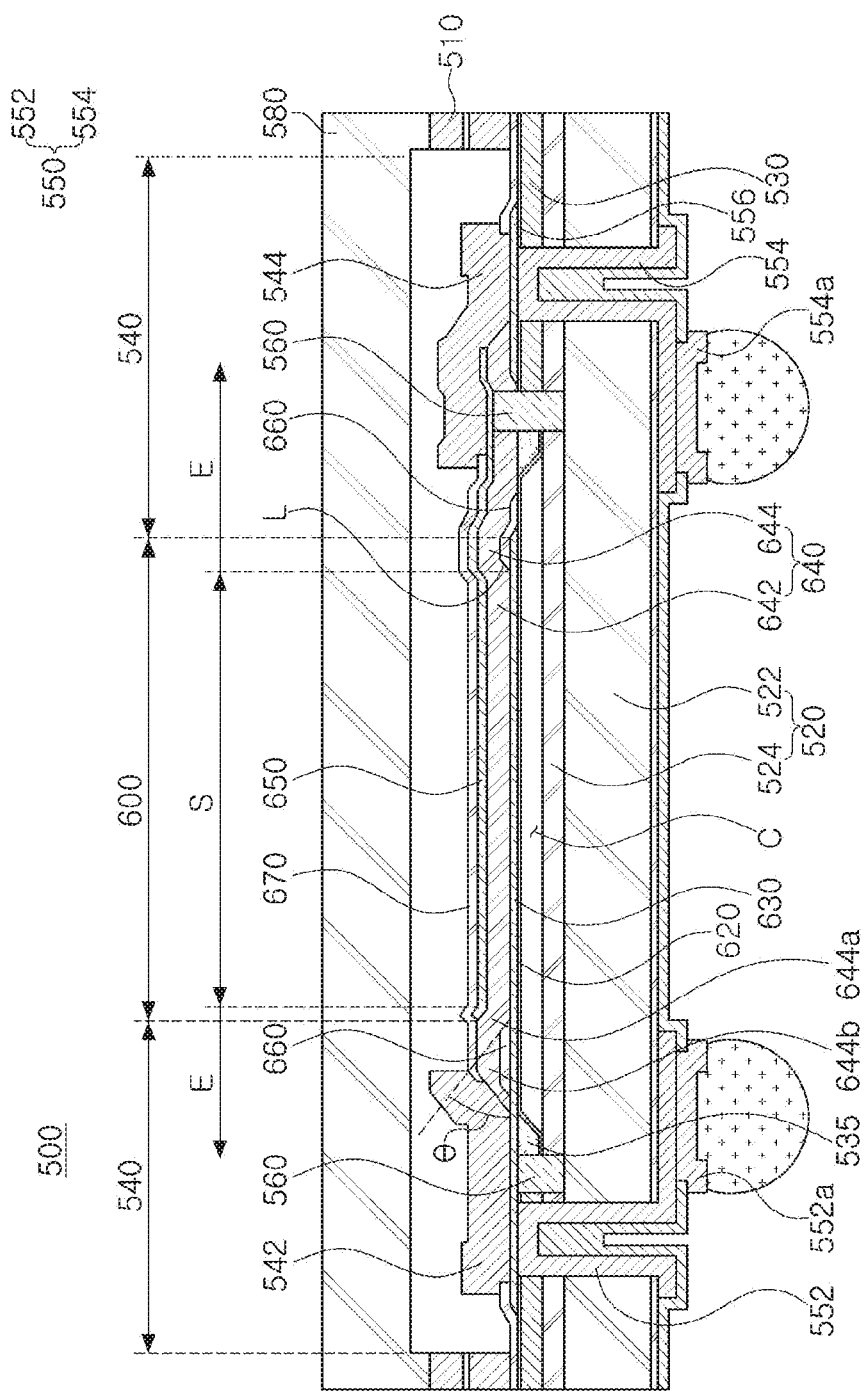
FIG. 4 is a cross-sectional view of the bulk acoustic wave filter device according to another example.

FIG. 4 is a cross-sectional view of a bulk acoustic wave filter device according to another example.

Referring to FIG. 4, a bulk acoustic wave filter device 500 may include a substrate 520, a resonance portion 600, a wiring portion 540, a connection electrode 550, a heat transfer member 560, and a cap 580, as an example.

The substrate 520 may be a silicon substrate. For example, the substrate 520 may be a silicon wafer or a silicon-on-insulator (SOI) type substrate.

An insulating layer 524 may be disposed on a top surface of the substrate 520 and may electrically isolate overlying configurations from the substrate 520. The insulating layer 524 serves to prevent the substrate 520 from being etched by an etching gas when a cavity is formed during a manufacturing process.

The insulating layer 524 may be formed of at least one of silicon dioxide ($SiO_2$), silicon nitride ($Si_3N_4$), aluminum oxide ($Al_2O_3$), and aluminum nitride (AlN), and may be formed by any one of a chemical vapor deposition process, an RF magnetron sputtering process, and an evaporation process.

A first layer 530 is disposed on the insulating layer 524 of the substrate 520. A cavity C and an etch stop portion 535 may be disposed inside the first layer 530. The cavity C is formed by removing a portion of the first layer 530 during a manufacturing process. The cavity C is formed inside the first layer 530, such that a bottom electrode 630 or the like, to be described later, disposed above the first layer 530, may be formed to be flat.

The etch stop portion 535 is disposed along a boundary of the cavity C. The etch stop portion 535 prevents etching from proceeding to a cavity region during a process of forming the cavity C.

The resonance portion 600 may include a membrane layer 620, a bottom electrode 630, a piezoelectric layer 640, a top electrode 650, an insertion layer 660, and a passivation layer 670, as an example.

The membrane layer 620 may form the cavity C, together with the substrate 520. The membrane layer 620 may be formed of a material having a low reactivity with respect to an etching gas when the first layer 530 is removed. The etch stop portion 535 is inserted into a groove portion along the membrane layer 620. The membrane layer 620 may be a dielectric layer containing any one of silicon nitride (Si3N4), silicon oxide (SiO2), manganese oxide (MgO), zirconium oxide (ZrO2), aluminum nitride (AlN), lead zirconate titanate (PZT), gallium arsenide (GaAs), hafnium oxide (HfO2), aluminum oxide (Al2O3), titanium oxide (TiO2), and zinc oxide (ZnO).

A seed layer, not illustrated, formed of aluminum nitride (AlN) may be disposed on the membrane layer 620. For example, the seed layer may be disposed between the membrane layer 620 and the bottom electrode 630. The seed layer may be formed using a dielectric or a metal having a hexagonal close-packed (HCP) crystal structure in addition to aluminum nitride (AlN). As an example, when the seed layer is a metal, the seed layer may be formed of titanium (Ti).

The bottom electrode 630 may be disposed on the membrane layer 620, and may have a portion disposed in an upper portion of the cavity C. The bottom electrode 630 may be used as either one of an input electrode and an output electrode inputting and/or outputting an electrical signal such as a radio-frequency (RF) signal, and the like.

The bottom electrode 630 may be formed using a conductive material such as molybdenum (Mo), or alloys thereof. However, a material of the bottom electrode 630 is not limited to molybdenum (Mo), and the bottom electrode 630 may be formed of a heat conducting material such as ruthenium (Ru), tungsten (W), iridium (Ir), platinum (Pt), copper (Cu), titanium (Ti), tantalum (Ta), nickel (Ni), chromium (Cr), and the like, or alloys thereof.

The piezoelectric layer 640 may be disposed to cover at least a portion of the bottom electrode 630 that is disposed above the cavity C. The piezoelectric layer 640 may be a portion causing a piezoelectric effect to convert electrical energy into mechanical energy in the form of an acoustic wave, and may be formed of any one of aluminum nitride (AlN), zinc oxide (ZnO), and lead zirconium titanium oxide (PZT; PbZrTiO). When the piezoelectric layer 640 is formed of aluminum nitride (AlN), the piezoelectric layer 640 may further include a rare earth metal. As an example, the rare earth metal may include at least one of scandium (Sc), erbium (Er), yttrium (Y), and lanthanum (La). As an example, a transition metal may include at least one of titanium (Ti), zirconium (Zr), hafnium (Hf), tantalum (Ta), and niobium (Nb). Magnesium (Mg), a divalent metal, may also be included.

The piezoelectric layer 640 includes a piezoelectric portion 642, disposed in a flat portion S, and a bent portion 644 disposed in an extending portion E.

The piezoelectric portion 642 is a portion directly laminated on a top surface of the bottom electrode 630. Accordingly, the piezoelectric portion 642 is interposed between the bottom electrode 630 and the top electrode 650 to be coplanar with the bottom electrode 630 and the top electrode 650.

The bent portion 644 may be defined as a region extending outwardly of the piezoelectric portion 642 to be disposed in the extending portion E.

The bent portion 644 is disposed on the insertion layer 660 and is raised to conform to a shape of the insertion layer 660. Thus, the piezoelectric layer 640 is bent at a boundary between the piezoelectric portion 642 and the bent portion 644, and the bent portion 644 is raised to correspond to a thickness and a shape of the insertion layer 660.

The bent portion 644 may be divided into an inclined portion 644a and an extended portion 644b.

The inclined portion 644a is a portion inclined along an inclined surface L of the insertion layer 660. The extended portion 644b is a portion extended in an outward direction from the inclined portion 644a.

The inclined portion 644a may be disposed parallel to the inclined surface L of the insertion layer 660 and may have an inclination angel equal to an inclination angle Θ of the inclined surface of the insertion layer 660.

The top electrode 650 may be disposed to cover at least a portion of the piezoelectric layer 640 disposed above the cavity C. The top electrode 650 may be used as either one of an input electrode and an output electrode inputting and/or outputting an electrical signal such as a radio-frequency (RF) signal, and the like. For example, when the bottom electrode 630 is used as an input electrode, the top electrode 650 may be used as an output electrode. When the bottom electrode 630 is used as an output electrode, the top electrode 650 may be used as an input electrode.

The top electrode 650 may be formed of a heat conducting material such as molybdenum (Mo), or alloys thereof. However, a material of the top electrode 650 is not limited to molybdenum (Mo), and the top electrode 650 may be formed of a heat conducting material such as ruthenium (Ru), tungsten (W), iridium (Ir), platinum (Pt), copper (Cu), titanium (Ti), tantalum (Ta), nickel (Ni), chromium (Cr), and the like, or alloys thereof.

The insertion layer 660 may be disposed between the bottom electrode 630 and the piezoelectric layer 640. The insertion layer 660 may be formed of a dielectric such as silicon oxide (SiO2), aluminum nitride (AlN), aluminum oxide (Al2O3), silicon nitride (Si3N4), manganese oxide (MgO), zirconium oxide (ZrO2), lead zirconate titanate (PZT), gallium arsenide (GaAs), hafnium oxide (HfO2), aluminum oxide (Al2O3), titanium oxide (TiO2), and zinc oxide (ZnO), but may be formed of a material different from that of the piezoelectric layer 640. As needed, a region, in which the insertion layer 660 is provided, may be formed as air, which may be implemented by removing the insertion layer 660 during a manufacturing process.

A thickness of the insertion layer 660 may be equal or similar to a thickness of the bottom electrode 630. The insertion layer 660 may be formed to have a thickness smaller than a thickness of the piezoelectric layer 640, or may be formed to have a thickness similar to the thickness of the piezoelectric layer 640. For example, the insertion layer 660 may be formed to have a thickness of 100 angstroms (Å) or more, and may be formed to have a thickness smaller than a thickness of the piezoelectric layer 640. The configuration of the insertion layer 660 is not limited thereto.

The insertion layer 660 may be disposed along a surface formed by the membrane layer 620, the bottom electrode 630, and the etch stop portion 535.

The insertion layer 660 may be disposed around the flat portion S to support the bent portion 644 of the piezoelectric layer 640. Accordingly, the bent portion 644 of the piezoelectric layer 640 may be divided into the inclined portion 644a and the extended portion 644b, depending on a shape of the insertion layer 660.

The insertion layer 660 may be disposed in a region other than the flat portion S. For example, the insertion layer 660 may be disposed in the entire region, or disposed in some regions except for the flat portion S.

The insertion layer 660 may have at least a portion disposed between the piezoelectric layer 640 and the bottom electrode 630.

A side surface of the insertion layer 660, disposed along the boundary of the flat portion S, may have a thickness increasing as a distance from the flat portion S increases. The insertion layer 660 may be formed as an inclined surface L having a side surface, disposed adjacent to the flat portion S, having a constant inclination angle Θ.

In the case in which the side surface of the insertion layer 660 is formed to have the inclination angle Θ less than 5 degrees, the insertion layer 660 should have a significantly small thickness or the inclined surface L should have a significantly large area to form the insertion layer 660. Therefore, it may be substantially difficult to implement such an insertion layer 660.

In the case in which the side surface of the insertion layer 660 is formed to have an inclination angle Θ greater than 70 degrees, the inclined portion 664a of the piezoelectric layer 640, laminated on the insertion layer 660, may also be formed to have an inclination angle greater than 70 degrees. In this case, since the piezoelectric layer 640 may be significantly bent, cracking may occur in the bent portion of the piezoelectric layer 640.

Accordingly, in the present example, the inclination angle Θ of the inclined surface L may be in a range of 5 degrees or more and 70 degrees or less.

The passivation layer 670 may be disposed in regions other than a region in which the bottom electrode 630 and the top electrode 650 overlap each other. The passivation layer 670 may prevent damage to the top electrode 650 and the bottom electrode 630 during a process.

Furthermore, a portion of the passivation layer 670 may be removed by etching for frequency control in a final process. For example, the thickness of the passivation layer 670 may be adjusted. As an example, the passivation layer 670 may be a dielectric layer containing any one of silicon nitride (Si3N4), silicon oxide (SiO2), manganese oxide (MgO), zirconium oxide (ZrO2), aluminum nitride (AlN), lead zirconate titanate (PZT), gallium arsenide (GaAs), hafnium oxide (HfO2), aluminum oxide (Al2O3), titanium oxide (TiO2), and zinc oxide (ZnO).

As an example, the resonance portion 600 refers to a region in which the bottom electrode 630, the piezoelectric layer 640, and the top electrode 650 all overlap each other, and the wiring portion 540 refers to a region in which the bottom electrode 630 or the top electrode 650 is disposed outside the resonance portion 600.

The wiring portion 540 is connected to the resonance portion 600. The bottom electrode 630 or the top electrode 650 extends to be disposed in the wiring portion 540. In a region of the wiring portion 540 in which the bottom electrode 630 is disposed, the membrane layer 620 and the first layer 530 may be disposed below the bottom electrode 630, and a first metal pad 542 may be disposed above the bottom electrode 630. In a region of the wiring portion 540 in which the top electrode 650 is disposed, the first layer 530, the piezoelectric layer 640, and the top electrode 650 may be sequentially laminated and a second metal pad 544 may be disposed to be connected to the top electrode 650.

The connection electrode 550 is disposed in the wiring portion 540 and serves to connect the bottom electrode 630 and the top electrode 650 to an external device. As an example, the connection electrode 550 may include a bottom electrode connection electrode 552 for connecting the bottom electrode 630 to an external device and a top electrode connection electrode 554 for connecting the top electrode 650 to an external device.

As an example, the bottom electrode connection electrode 552 and the top electrode connection electrode 554 may be disposed to penetrate through the substrate 520. The bottom electrode connection electrode 552 may be directly connected to the bottom electrode 630, and the top electrode connection electrode 554 may be connected to the top electrode 650 via the second metal pad 544 and a connection member 556.

Connection pads 552a and 554a, disposed below the substrate 520, may be mounted on the bottom electrode connection electrode 552 and the top electrode connection electrode 554, respectively. Each of the connection pads 552a and 554b may be provided with a solder through which they may be connected to a mainboard, not illustrated.

The connection electrode 554 may serve to discharge heat, generated by the resonance portion 600, to the outside.

As an example, the connection electrode 550 may be a through-silicon-via (TSV) electrode.

The heat transfer member 560 connects at least one of the bottom and top electrodes 630 and 650, disposed in the wiring portion 540, to the substrate 520. The heat transfer member 560 serves to provide a heat transfer path through which heat, generated by the resonance portion 200, is transferred to the substrate 520. As an example, the heat transfer member 560 may be formed of a heat conducting material such as molybdenum (Mo), ruthenium (Ru), tungsten (W), iridium (Ir), platinum (Pt), copper (Cu), titanium (Ti), tantalum (Ta), nickel (Ni), chromium (Cr), aluminum (Al), or alloys thereof.

In the case in which the heat transfer member 560 is connected to the bottom electrode 630, the first layer 530 and the heat transfer member 560 are disposed to penetrate through the membrane layer 620. In the case in which the heat transfer member 560 is connected to the top electrode 650, the heat transfer member 560 is disposed to penetrate through the first layer 530, the membrane layer 620, and the piezoelectric layer 640.

The heat transfer member 560 connects the bottom electrode 630 and the top electrode 650 to the substrate 520 to serve as a heat transfer path through which the heat, generated by the resonance portion 600, is transferred to the substrate 520. As an example, the heat transfer member 560 penetrates through the insulating layer 524 to be connected to a base 522 of the substrate 520.

Accordingly, since the heat, generated by the resonance portion 600, is transferred to the substrate 520 through the heat transfer member 560 together with the connection electrode 550, heat dissipation efficiency may be improved.

The cap 580 is coupled to the substrate 520 to form an internal space together with the substrate 520. The cap 580 and the substrate 520 are bonded through an adhesive member 510. The adhesive member 510 may be formed of a metal such as tin (Sn), gold (Au), or the like. As an example, the cap 580 may be a silicon wafer or a silicon-on-insulator (SOI) type substrate.

Since the heat, generated by the resonance portion 600, is transferred to the substrate 520 through the heat transfer member 560, heat dissipation may be smoothly performed.

Accordingly, frequency shift, caused when a temperature of the resonance portion 600 is rapidly increased, and loss, occurring at a specific frequency, may be reduced. Moreover, degradation in isolation characteristics, caused when a temperature of the resonance portion 600 is rapidly increased, may be prevented.

Figure 5:
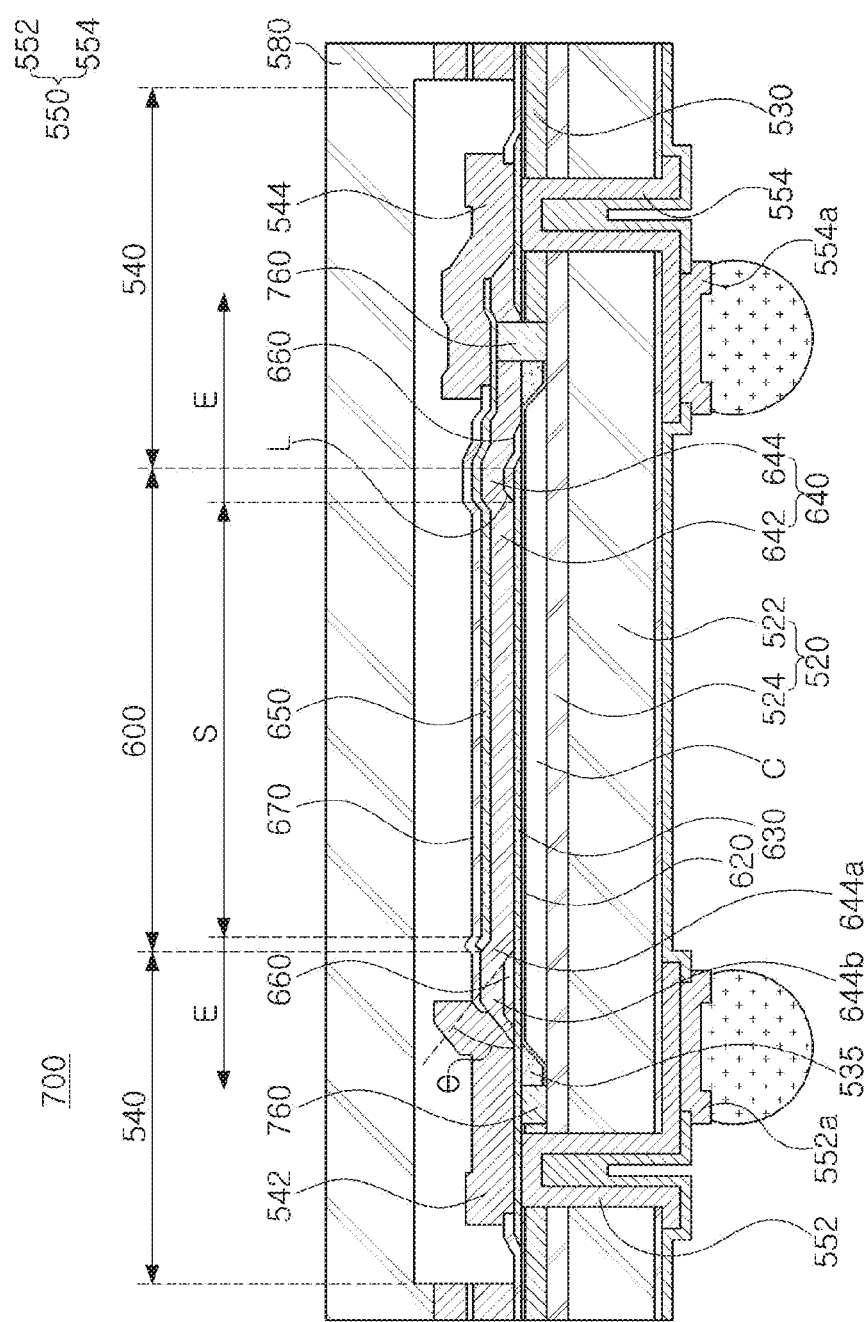
FIG. 5 is a cross-sectional view of the bulk acoustic wave filter device according to another example.

FIG. 5 is a cross-sectional view of a bulk acoustic wave filter device according to another example.

Referring to FIG. 5, a bulk acoustic wave filter device 700 includes a substrate 520, a resonance portion 600, a wiring portion 540, a connection electrode 550, a heat transfer member 760, and a cap 580, as an example.

Since the substrate 520, the resonance portion 600, the wiring portion 540, the connection electrode 550, and the cap 580 are the same as described with reference to FIG. 4, detailed descriptions thereof will be omitted herein.

A heat transfer member 760 connects at least one of the bottom and top electrodes 630 and 650, disposed in the wiring portion 540, to the substrate 520. The heat transfer member 760 serves to provide a heat transfer path through which heat, generated by the resonance portion 600, is transferred to the substrate 520. As an example, the heat transfer member 760 may be formed of a heat conducting material such as molybdenum (Mo), ruthenium (Ru), tungsten (W), iridium (Ir), platinum (Pt), copper (Cu), titanium (Ti), tantalum (Ta), nickel (Ni), chromium (Cr), aluminum (Al), or alloys thereof.

In the case in which the heat transfer member 760 is connected to the bottom electrode 630, the heat transfer member 760 is disposed to penetrate through the membrane layer 620. In the case in which the heat transfer member 760 is connected to the top electrode 650, the heat transfer member 760 is disposed to penetrate through the first layer 530, the membrane layer 620, and the piezoelectric layer 640.

The heat transfer member 760 connects the bottom electrode 630 and the top electrode 650 to the substrate 520 to serve as a heat transfer path through which the heat, generated by the resonance portion 600, is transferred to the substrate 520. As an example, the heat transfer member 760 penetrates through the insulating layer 524 of the substrate 520.

Accordingly, since the heat, generated by the resonance portion 600, is transferred to the substrate 520 through the heat transfer member 760 together with a connection electrode 550, heat dissipation efficiency may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave filter device comprising:
   a substrate comprising an insulating layer;
   a resonance portion comprising a bottom electrode disposed on the substrate, a piezoelectric layer disposed above at least a portion of the bottom electrode, a top electrode disposed above at least a portion of the piezoelectric layer, and a cavity disposed below the bottom electrode;
   a wiring portion connected to the resonance portion such that the top electrode or the bottom electrode extends into the wiring portion;
   a connection electrode configured to connect the top electrode and the bottom electrode to an external device; and
   a heat transfer member disposed spaced apart from the cavity and penetrating the substrate, and connecting a portion of at least one of the bottom electrode and the top electrode that is disposed in the wiring portion to the substrate.

2. The bulk acoustic wave filter device of claim 1, wherein the heat transfer member is disposed between the connection electrode and the cavity.

3. The bulk acoustic wave filter device of claim 1, wherein the heat transfer member is connected to the insulating layer of the substrate or connected to a base of the substrate disposed below the insulating layer.

4. The bulk acoustic wave filter device of claim 1, wherein the heat transfer member comprises a heat conducting material including one or more of molybdenum (Mo), ruthenium (Ru), tungsten (W), iridium (Ir), platinum (Pt), copper (Cu), titanium (Ti), tantalum (Ta), nickel (Ni), chromium (Cr), aluminum (Al), or alloys thereof.

5. The bulk acoustic wave filter device of claim 1, wherein the resonance portion comprises:
   a membrane layer that forms the cavity together with the substrate; and
   a passivation layer disposed above the top electrode, wherein
   the bottom electrode comprises a portion disposed in an upper portion of the cavity;
   the piezoelectric layer comprises a portion disposed to cover the bottom electrode;
   the top electrode comprises a portion disposed to cover the piezoelectric layer; and
   the passivation layer is at least partially disposed in a region in which the bottom electrode and the top electrode do not overlap each other.

6. The bulk acoustic wave filter device of claim 5, wherein the heat transfer member is connected to the bottom electrode and penetrates through the membrane layer.

7. The bulk acoustic wave filter device of claim 6, further comprising:
   a first metal pad disposed above the bottom electrode.

8. The bulk acoustic wave filter device of claim 5, wherein the heat transfer member is connected to the top electrode and penetrates through the membrane layer and the piezoelectric layer.

9. The bulk acoustic wave filter device of claim 8, further comprising:
   a second metal pad disposed above the top electrode.

10. The bulk acoustic wave filter device of claim 1, wherein the resonance portion comprises:
a membrane layer that forms the cavity together with the substrate; and
an insertion layer disposed to cover at least a portion of the bottom electrode, wherein
the bottom electrode is disposed above the membrane layer;
the insertion layer is disposed to cover at least a portion of the bottom electrode;
the piezoelectric layer is disposed on the bottom electrode to cover the insertion layer; and
the top electrode comprises a portion disposed above the piezoelectric layer.

11. The bulk acoustic wave filter device of claim 10, further comprising:
an etch stop portion disposed to cover the cavity.

12. The bulk acoustic wave filter device of claim 11, further comprising:
a first layer disposed outside of the etch stop portion.

13. The bulk acoustic wave filter device of claim 12, wherein the heat transfer member is connected to the top electrode and penetrates through the piezoelectric layer, the membrane layer, and the first layer.

14. The bulk acoustic wave filter device of claim 12, wherein the heat transfer member is connected to the bottom electrode and penetrates through the membrane layer and the first layer.

15. The bulk acoustic wave filter device of claim 10, wherein the piezoelectric layer comprises a piezoelectric portion, disposed in a flat portion, and a bent portion disposed in an extending portion that extends from the piezoelectric layer.

16. A bulk acoustic wave filter device comprising:
a substrate comprising an insulating layer;
a resonance portion comprising a bottom electrode disposed on the substrate, a piezoelectric layer disposed above at least a portion of the bottom electrode, and a top electrode disposed above at least a portion of the piezoelectric layer;
a wiring portion connected to the resonance portion such that the bottom electrode or the top electrode extends into the wiring portion;
a connection electrode configured to connect the top electrode and the bottom electrode to an external device; and
a heat transfer member disposed spaced apart from the cavity and penetrating the substrate, and connecting a portion of the top electrode or the bottom electrode that extends into the wiring portion to the substrate.

17. A bulk acoustic wave filter device comprising:
a substrate;
a resonance portion comprising a top electrode, a bottom electrode, a piezoelectric layer disposed between the top electrode and the bottom electrode, and a membrane layer disposed between the bottom electrode and the substrate to form a cavity with the substrate;
a first heat transfer member disposed spaced apart from the cavity and penetrating the substrate, and connecting a portion of the top electrode that extends beyond the resonance portion to the substrate; and
a second heat transfer member disposed spaced apart from the cavity and penetrating the substrate, and connecting a portion of the bottom electrode that extends beyond the resonance portion to the substrate.

18. A bulk acoustic wave filter device comprising:
a substrate comprising an insulating layer;
a resonance portion comprising a bottom electrode disposed on the substrate, a piezoelectric layer disposed above at least a portion of the bottom electrode, a top electrode disposed above at least a portion of the piezoelectric layer, and a cavity disposed below the bottom electrode;
a wiring portion connected to the resonance portion such that the top electrode or the bottom electrode extends into the wiring portion;
a connection electrode configured to connect the top electrode and the bottom electrode to an external device; and
a heat transfer member disposed outside of the cavity and connecting a portion of at least one of the bottom electrode and the top electrode that is disposed in the wiring portion to the substrate,
wherein the resonance portion comprises a passivation layer disposed above the top electrode and at least partially disposed in a region in which the bottom electrode and the top electrode do not overlap each other.

19. A bulk acoustic wave filter device comprising:
a substrate comprising an insulating layer;
a resonance portion comprising a bottom electrode disposed on the substrate, a piezoelectric layer disposed above at least a portion of the bottom electrode, a top electrode disposed above at least a portion of the piezoelectric layer, and a cavity disposed below the bottom electrode;
a wiring portion connected to the resonance portion such that the top electrode or the bottom electrode extends into the wiring portion;
a connection electrode configured to connect the top electrode and the bottom electrode to an external device; and
a heat transfer member disposed outside of the cavity and connecting a portion of at least one of the bottom electrode and the top electrode that is disposed in the wiring portion to the substrate,
wherein the resonance portion comprises an insertion layer disposed to cover at least a portion of the bottom electrode.

* * * * *